(12) United States Patent
Matsui et al.

(10) Patent No.: US 8,605,237 B2
(45) Date of Patent: Dec. 10, 2013

(54) COLOR FILTER AND LIQUID CRYSTAL DISPLAY DEVICE, AND EXPOSURE MASK

(75) Inventors: Kohei Matsui, Tokyo (JP); Ryosuke Yasui, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 249 days.

(21) Appl. No.: 13/138,928

(22) PCT Filed: Apr. 28, 2010

(86) PCT No.: PCT/JP2010/003075
§ 371 (c)(1),
(2), (4) Date: Oct. 25, 2011

(87) PCT Pub. No.: WO2010/125825
PCT Pub. Date: Nov. 4, 2010

(65) Prior Publication Data
US 2012/0038866 A1 Feb. 16, 2012

(30) Foreign Application Priority Data

Apr. 30, 2009 (JP) ................................ 2009-110489

(51) Int. Cl.
*G02F 1/1335* (2006.01)
(52) U.S. Cl.
USPC ......................................... 349/106; 349/110
(58) Field of Classification Search
USPC .......................................... 349/106, 110–111
See application file for complete search history.

(56) References Cited

U.S. PATENT DOCUMENTS

| 7,804,562 B2 * | 9/2010 | Chang et al. | 349/106 |
| 7,920,243 B2 * | 4/2011 | Lee et al. | 349/155 |
| 2004/0012966 A1 | 1/2004 | Takasaki et al. | |
| 2007/0111115 A1 | 5/2007 | Takasaki et al. | |

FOREIGN PATENT DOCUMENTS

| JP | 8-136718 | 5/1996 |
| JP | 2004-252396 | 9/2004 |
| JP | 2007-121344 | 5/2007 |
| JP | 2008-216593 | 9/2008 |

OTHER PUBLICATIONS

International Search Report of PCT/JP2010/003075 mailed Jun. 15, 2010.

* cited by examiner

*Primary Examiner* — James Dudek

(57) ABSTRACT

A color filter which is able to form a liquid crystal display device that has few variation in display caused due to difference in exposure illuminance among exposure heads and/or misalignment in pattern position, and that is excellent in display quality, and an exposure mask used for producing the color filter are provided. A color filter 1 includes: a substrate 2; black matrixes 3 provided on the substrate 2; and a plurality of colored layers 4 which partially overlap the black matrixes 3 in at least a first direction. The widths of overlap portions 5 in which the black matrixes 3 and the colored layers 4 overlap each other in the first direction are varied over the entirety of a display area, and the degree of the variation is uniformly distributed over the entirety of the display area. As a result, even if the sizes of the overlap portions 5 are partially varied due to misalignment in position of the exposure heads and/or change of exposure condition, the partial variation is blended into the variation of the widths distributed over the entirety of the display area, so that a varied state can be prevented from becoming conspicuous as a whole.

9 Claims, 8 Drawing Sheets

COLOR FILTER AND LIQUID CRYSTAL DISPLAY DEVICE, AND EXPOSURE MASK

CROSS-REFERENCE TO RELATED APPLICATION

This application claims the benefit under 35 U.S.C. Section 371, of PCT International Application No. PCT/JP2010/003075, filed Apr. 28, 2010, which claimed priority to Japanese Application No. 2009-110489, filed Apr. 30, 2009 in the Japanese Patent Office, the disclosures of which are hereby incorporated by reference.

TECHNICAL FIELD

The present invention relates to color filters for use in liquid crystal display devices, and liquid crystal display devices, and exposure masks for producing the color filters.

BACKGROUND ART

In recent years, increase in size of liquid crystal display devices requires increase in size of color filters for use in the liquid crystal display devices. In a process of producing a color filter, patterning is performed by using a photolithography method to form colored layers and black matrixes. In a one-shot exposure method using a real-size exposure mask, a large exposure mask needs to be used. Since such a large exposure mask is very expensive, a problem arises that production cost for the color filters may be increased.

In order to solve this problem, a method (hereinafter, referred to as a "small mask continuous exposure method") may be used in which an exposure device having a plurality of exposure heads mounted thereto is used, and a small exposure mask is mounted to each exposure head, and exposure to light is repeatedly performed for a substrate that is a subject to be exposed to light such that the entire surface of the substrate is exposed to light.

FIG. 7 is a diagram illustrating an arrangement of exposure masks in the small mask continuous exposure method.

Exposure masks 18 are mounted to a plurality of exposure heads, respectively, and are aligned in two rows in the X-axis direction. The exposure masks 18 mounted to exposure heads in one of the rows are arranged so as to complement spaces between the exposure masks 18 by using the exposure masks 18 mounted to corresponding adjacent exposure heads in the other of the rows, so that pitches between the mask patterns formed on a photomask become uniform without generating any space.

More specifically, spaces are provided between the exposure masks in each row, and patterning for the spaces in one of the rows is performed through baking so as to be mutually complemented by masks aligned in the other of the rows. For example, in the drawings, a portion between a portion exposed to light by using the exposure mask 18 positioned at a position P1 and a portion exposed to light by using the exposure mask 18 positioned at a position P2 is exposed to light by using the exposure mask 18 positioned at a position P3. Thus, end portions of each exposure pattern in the X-axis direction are joined to each other (hereinafter, a portion at which the exposure patterns are joined to each other is referred to as a "joining portion").

CITATION LIST

Patent Literature

Patent Literature 1: Japanese Laid-Open Patent Publication No. 2007-121344

Patent Literature 2: Japanese Laid-Open Patent Publication No. 2008-216593

SUMMARY OF THE INVENTION

Problems to be Solved by the Invention

The small mask continuous exposure method has a problem that difference in exposure illuminance between the exposure heads, deviation of an optical axis relative to a substrate, misalignment of patterns of the exposure masks, misalignment in position between the exposure masks and the substrate, and the like occur, which abruptly changes film thicknesses, line widths, and positions of patterns for colored layers in the joining portions.

FIG. 8 is a cross-sectional view schematically illustrating a simplified structure of a liquid crystal display device near the joining portion.

A colored layer 14 partially overlaps a black matrix 13 in the X-axis direction, to form an overlap portion 15. In a case where line widths of the patterns for the colored layers are different, and/or positions of the patterns for the colored layers are misaligned between in both portions lateral to the joining portion, the widths of the overlap portions 15 are different between in a region (hereinafter, referred to as a "region A") to the left of the joining portion (indicated by L in FIG. 8) and in a region (hereinafter, referred to as a "region B") to the right of the joining portion, for example, as shown in FIG. 8. Thus, orientation of liquid crystal 17 sealed between a substrate 12 and an opposing substrate 16 is different between in both portions lateral to the joining portion. Therefore, in the liquid crystal display device, this difference becomes conspicuous and viewed as a partial variation.

Therefore, an object of the present invention is to make available a color filter which can form a liquid crystal display device that prevents the partial variation in display from becoming conspicuous, and that is excellent in display quality, and an exposure mask for producing the color filter.

Solution to the Problems

The present invention is directed to a color filter for use in a liquid crystal display device having a plurality of pixels aligned in a first direction and a second direction orthogonal to the first direction. The color filter includes: a substrate; black matrixes provided on the substrate; and a plurality of colored layers that partially overlap the black matrixes in at least the first direction. The widths of overlap portions in which the black matrixes and the plurality of colored layers overlap each other in the first direction are varied over the entirety of a display area, and a degree of variation of the widths of the overlap portions is uniform over the entirety of the display area.

Advantageous Effects of the Invention

The use of the color filter according to the present invention enables variation in width of the overlap portions to be uniformly distributed over the entirety of the display area. Therefore, it is possible to realize a liquid crystal display device that prevents, even if formed colored patterns are varied in joining portions during exposure, the variation of colored patterns from becoming conspicuous, and that is excellent in display quality, and a color filter for use in the liquid crystal display device.

DESCRIPTION OF EMBODIMENTS

Figure 1:
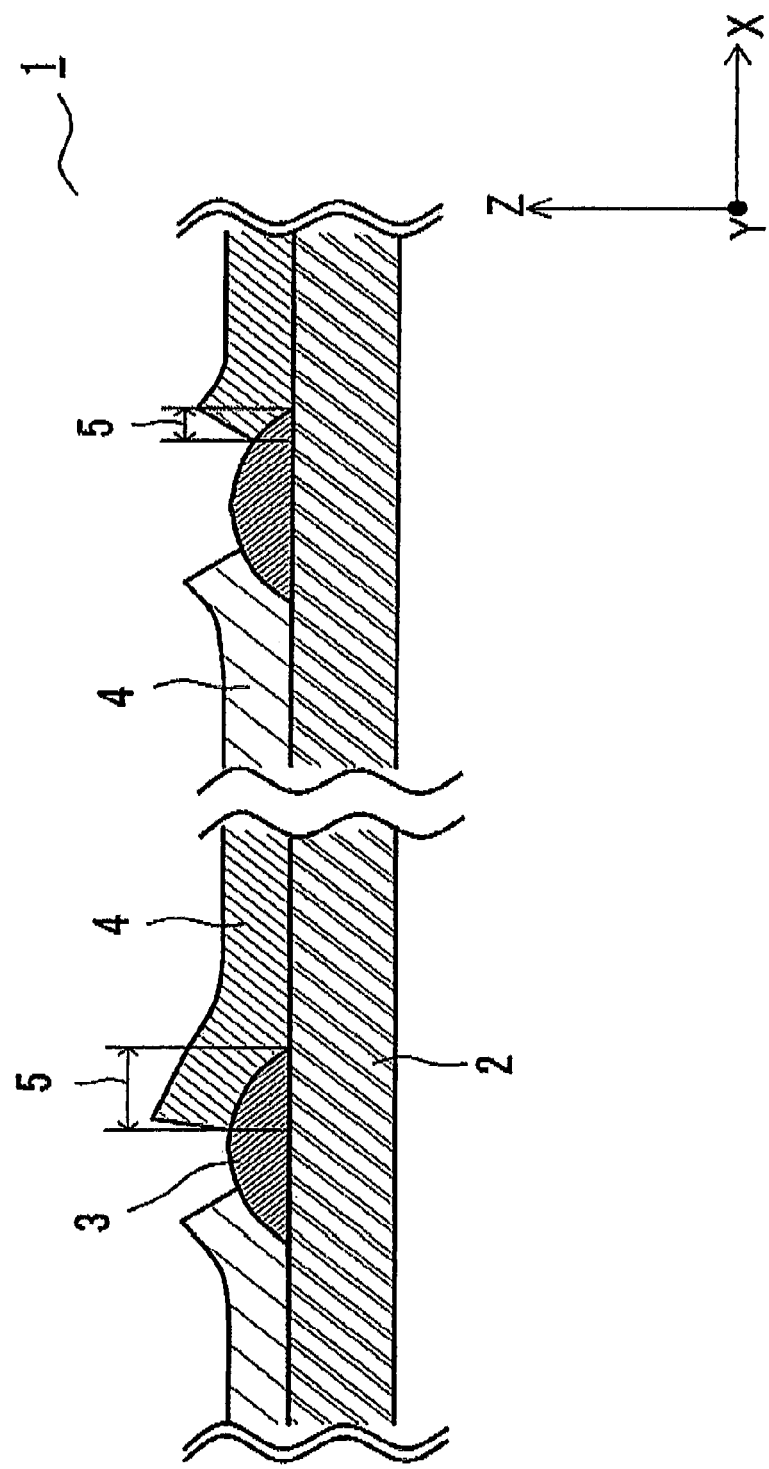
FIG. 1 is a cross-sectional view illustrating a schematic structure of a color filter according to an embodiment of the present invention.

FIG. 1 is a cross-sectional view illustrating a schematic structure of a color filter according to an embodiment of the present invention.

A color filter 1 according to an embodiment of the present invention is used for a liquid crystal display device having a plurality of pixels aligned in the X-axis direction and the Y-axis direction, and includes: a substrate 2, black matrixes 3, and colored layers 4. The colored layers 4 are formed on the substrate 2 by using resists corresponding to colors of red, green, and blue in a lithography method so as to partially overlap the black matrixes 3 in the X-axis direction. An overlap portion 5 is a portion on which the colored layer 4 and the black matrix 3 described above overlap each other. The height (the Z-axis direction) of the colored layer 4 is changed near the overlap portion 5, thereby influencing the orientation of liquid crystal as described below.

As described above, in the small mask continuous exposure method, the width of the overlap portion 5 is likely to be deviated from a designed value due to misalignment of the positions of exposure heads and/or variation in exposure condition (FIG. 1). The deviation of the widths of the overlap portions 5 leads to variation in orientation of liquid crystal molecules, thereby causing partial variation in display to occur on pixel areas. Therefore, in the color filter 1 according to the present invention, the deviation in width of the overlap portion 5 as shown in FIG. 1 is intentionally generated over the entirety of the display area, and the degree of the deviation (variation in width of the overlap portions 5) is uniformly distributed over the entirety of the display area. More specifically, at least two values of widths are used for the overlap portions 5 formed on the exposure area which is exposed to light by using a single exposure head. In the exposure area, a portion (a portion in which the overlap width is changed) at which the width of the overlap portion 5 in the X-axis direction is switched appears at least twice. Further, in each exposure area which is exposed to light by a corresponding one of the exposure heads, variation in width of the overlap portions 5 is uniformly distributed. As a result, since it is relatively difficult to visually recognize partial variation tendency (variation in display), in a case where the pixel areas are entirely viewed on a macro scale, quality of an image can be improved.

Next, an exposure mask 8 used for producing the color filter according to the present embodiment will be described with reference to FIG. 2 to FIG. 6.

Figure 2:
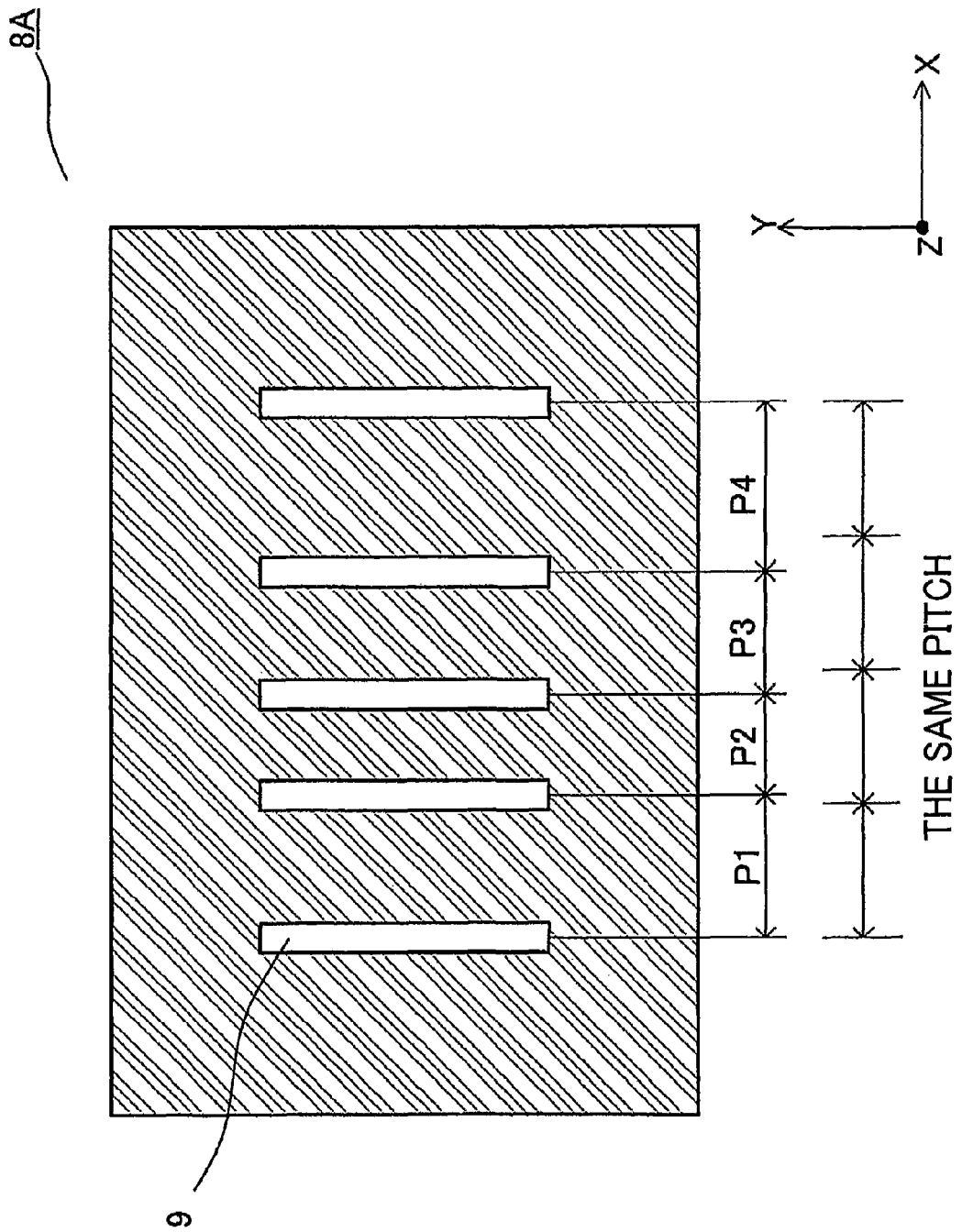
FIG. 2 is a schematic diagram illustrating an exposure mask in which pitches between transmission sections are randomly varied.

FIG. 2 is a schematic diagram illustrating an exposure mask in which pitches between transmission sections are randomly varied.

An exposure mask 8A includes transmission sections 9 each of which is slit-shaped, and transmits light. For example, the exposure mask 8A is preferably used which is formed by chromium being deposited on the entire surface of a substrate, and then chromium on portions corresponding to the transmission sections 9 being removed.

In the exposure mask 8A shown FIG. 2, although all the transmission sections 9 have the same width, the pitches P1 to P4 are not the same as shown in FIG. 2. The pitch represents a distance between virtual central lines of adjacent transmission sections. Further, the same pitch represents a pitch by which the virtual central lines of the transmission sections are equally spaced from each other.

When a plurality of the exposure masks 8A are used to produce the color filter in the small mask continuous exposure method, the variation of the pitches between the colored layers 4 is uniformly distributed over the entirety of the display area to the same degree. When the pitches between the colored layers 4 are varied, the widths of the overlap portions 5 are varied. Therefore, the variation in width of the overlap portions 5 is uniformly distributed over the entirety of the display area to the same degree.

Figure 3:
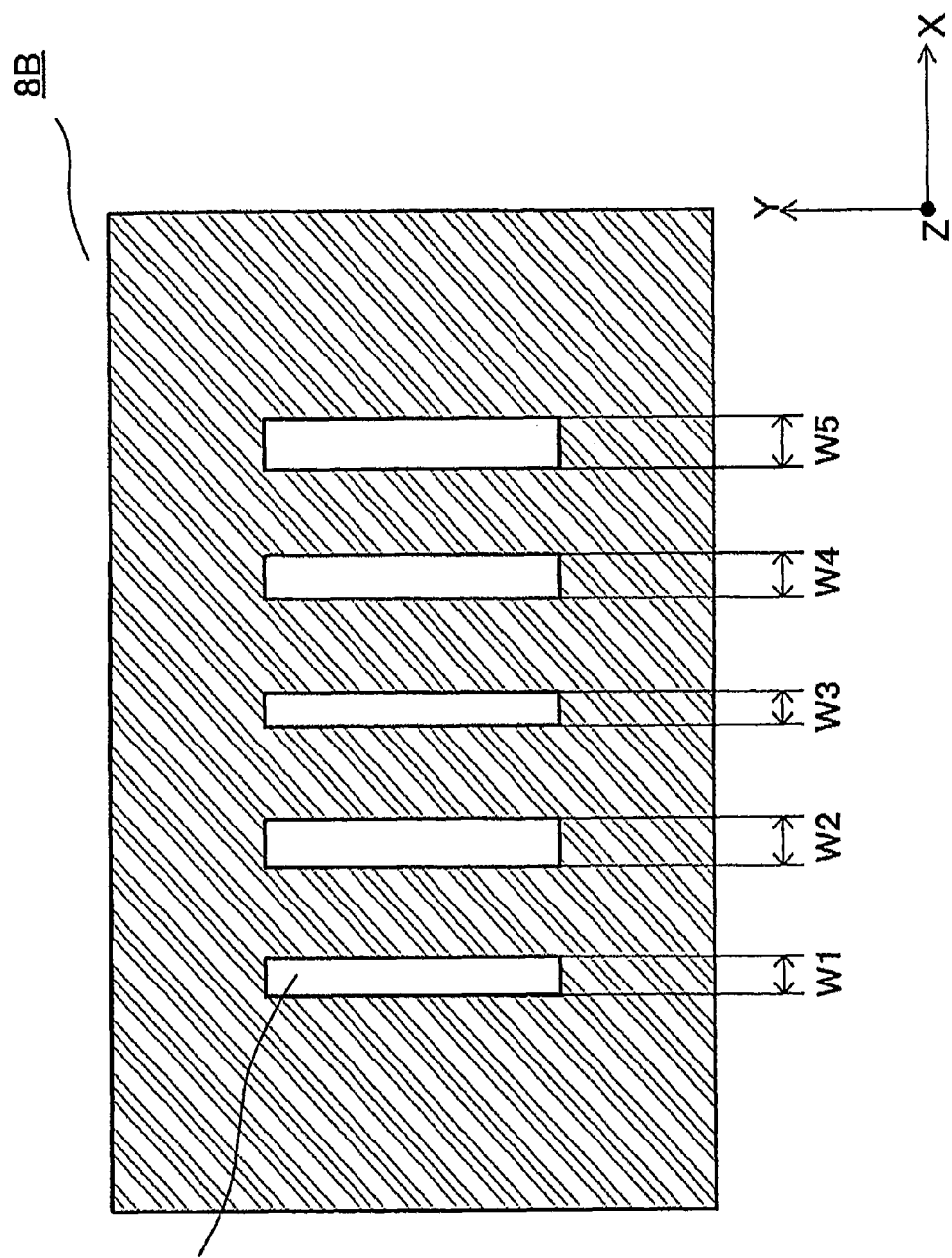
FIG. 3 is a schematic diagram illustrating an exposure mask in which widths of transmission sections are randomly varied.

FIG. 3 is a schematic diagram illustrating an exposure mask in which widths of transmission sections are randomly varied.

In an exposure mask 8B, although transmission sections 9 are arranged with the same pitch, the widths W1 to W5 are not the same as shown in FIG. 3.

In the color filter 1 which is produced by using the exposure mask 8B in the small mask continuous exposure method, variation in width of the colored layers 4 is uniformly distributed over the entirety of the display area to the same degree. When the widths of the colored layers 4 are varied, the widths of the overlap portions 5 are varied. Therefore, variation in width of the overlap portions 5 is uniformly distributed over the entirety of the display area to the same degree.

Figure 4:
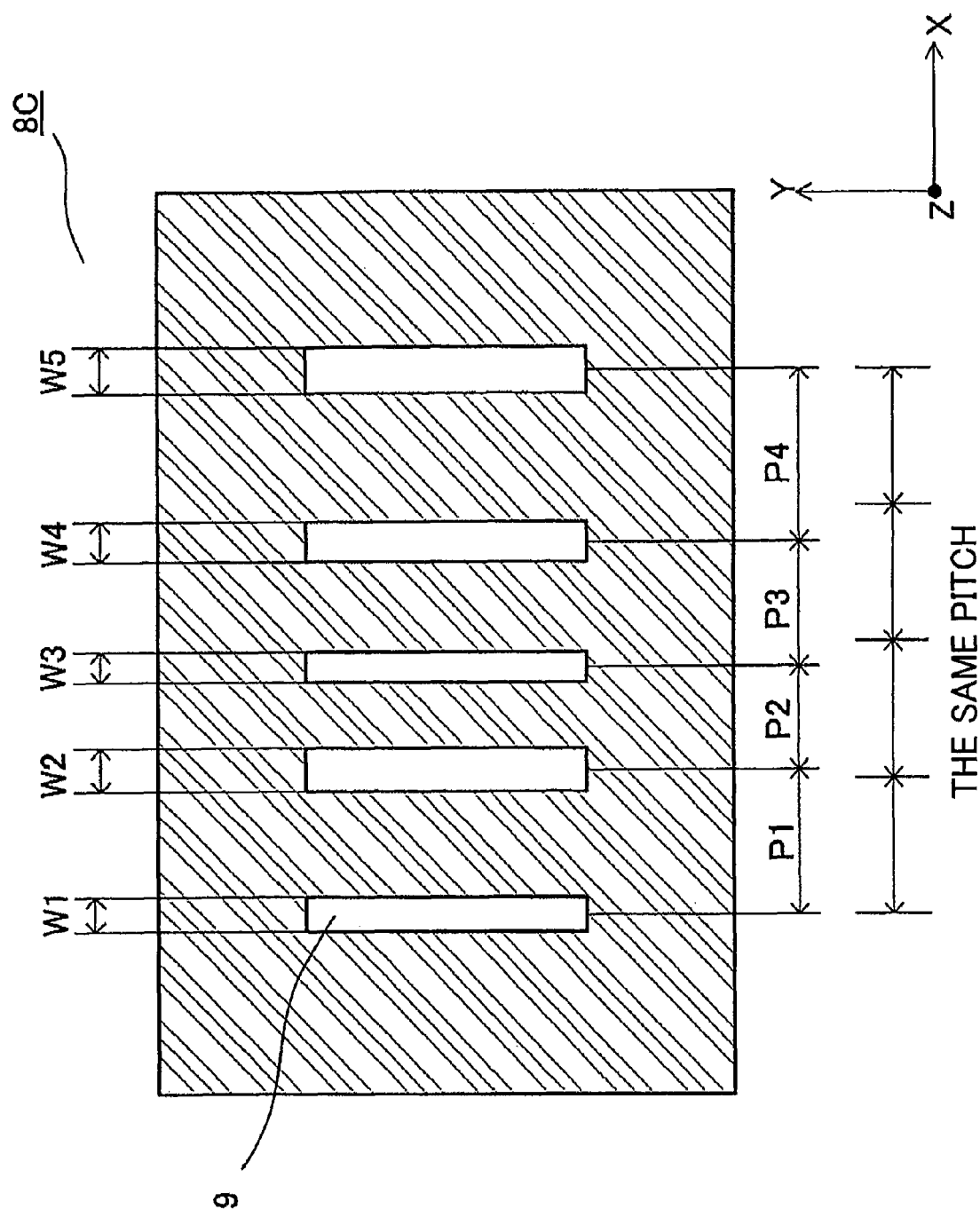
FIG. 4 is a schematic diagram illustrating an exposure mask in which pitches between transmission sections and widths of the transmission sections are randomly varied.

FIG. 4 is a schematic diagram illustrating an exposure mask in which pitches between transmission sections and widths of the transmission sections are randomly varied.

In an exposure mask 8C, the pitches P1 to P4 between transmission sections 9, and the widths W1 to W5 of the transmission sections 9 are randomly varied.

In the color filter 1 which is produced by using the exposure mask 8C in the small mask continuous exposure method, variation in width of the colored layers 4 and variation of the pitches between the colored layers 4 are uniformly distributed over the entirety of the display area to the same degree. When the widths of the colored layers 4 are varied, the widths of the overlap portions 5 are varied. Further, also when the pitches between the colored layers 4 are varied, the widths of the overlap portions 5 are varied. As a result, variation in width of the overlap portions 5 is uniformly distributed over the entirety of the display area to the same degree.

Figure 5:
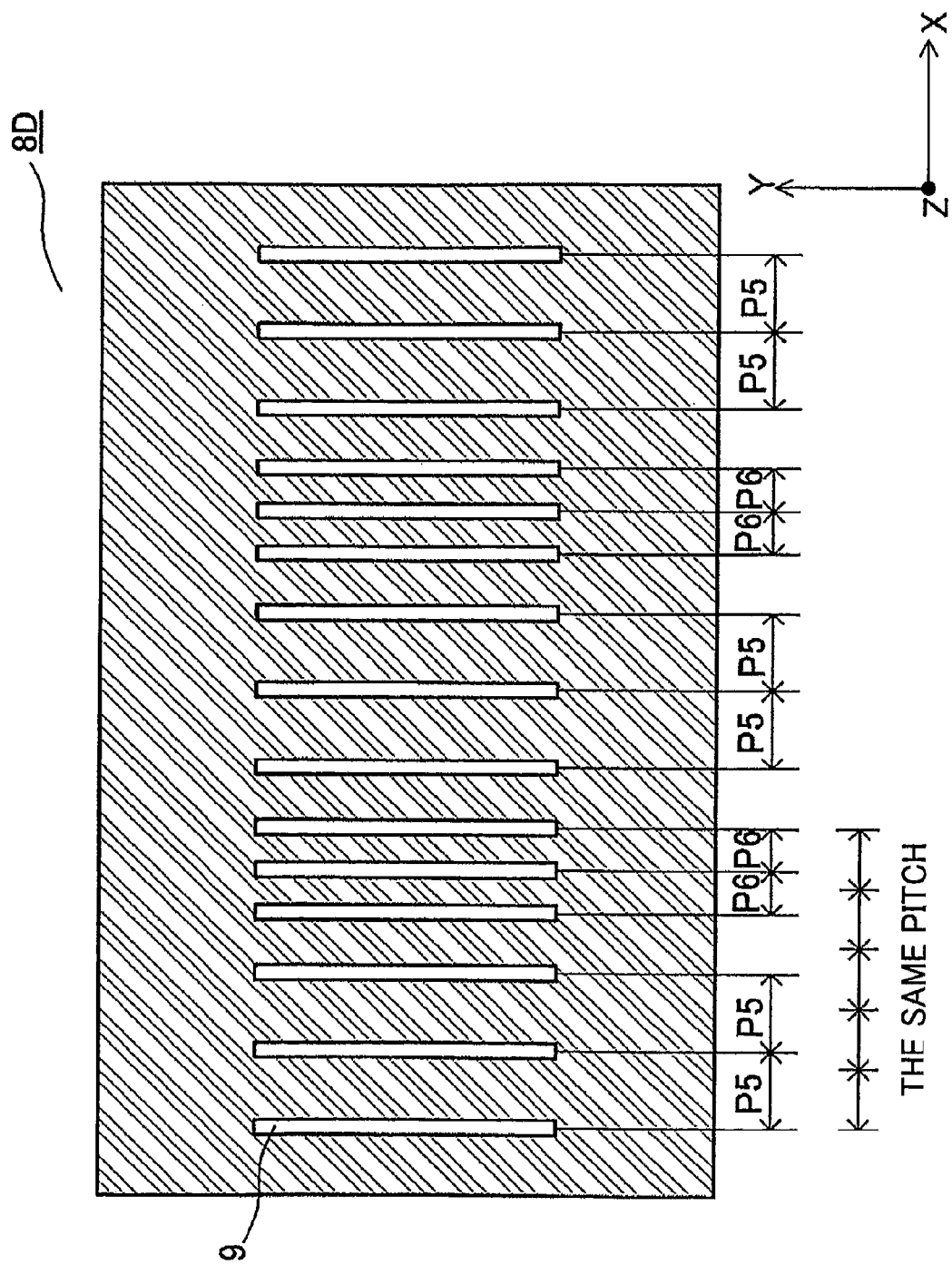
FIG. 5 is a schematic diagram illustrating an exposure mask in which pitches between transmission sections are switched every three transmission sections.

FIG. 5 is a schematic diagram illustrating an exposure mask in which pitches between transmission sections are switched every three transmission sections.

In an exposure mask 8D, although all the transmission sections 9 have the same width, the arrangement pitches repeatedly alternate between P5 and P6 every three transmission sections as shown in FIG. 5.

In the color filter 1 which is produced by using the exposure mask 8D in the small mask continuous exposure method, the pitches between the colored layers 4 are repeatedly switched every three pixels over the entirety of the display area. When the pitches between the colored layers 4 are varied, the widths of the overlap portions 5 are also varied. Therefore, the widths of the overlap portions 5 are repeatedly switched every three pixels over the entirety of the display area. When the overlap portions are repeatedly switched regularly every three pixels as described above, minute variations appear over the entirety of the display area in the liquid crystal display device, and variation which is conspicuous in a specific portion due to partial variation is not visually recognized.

Figure 6:
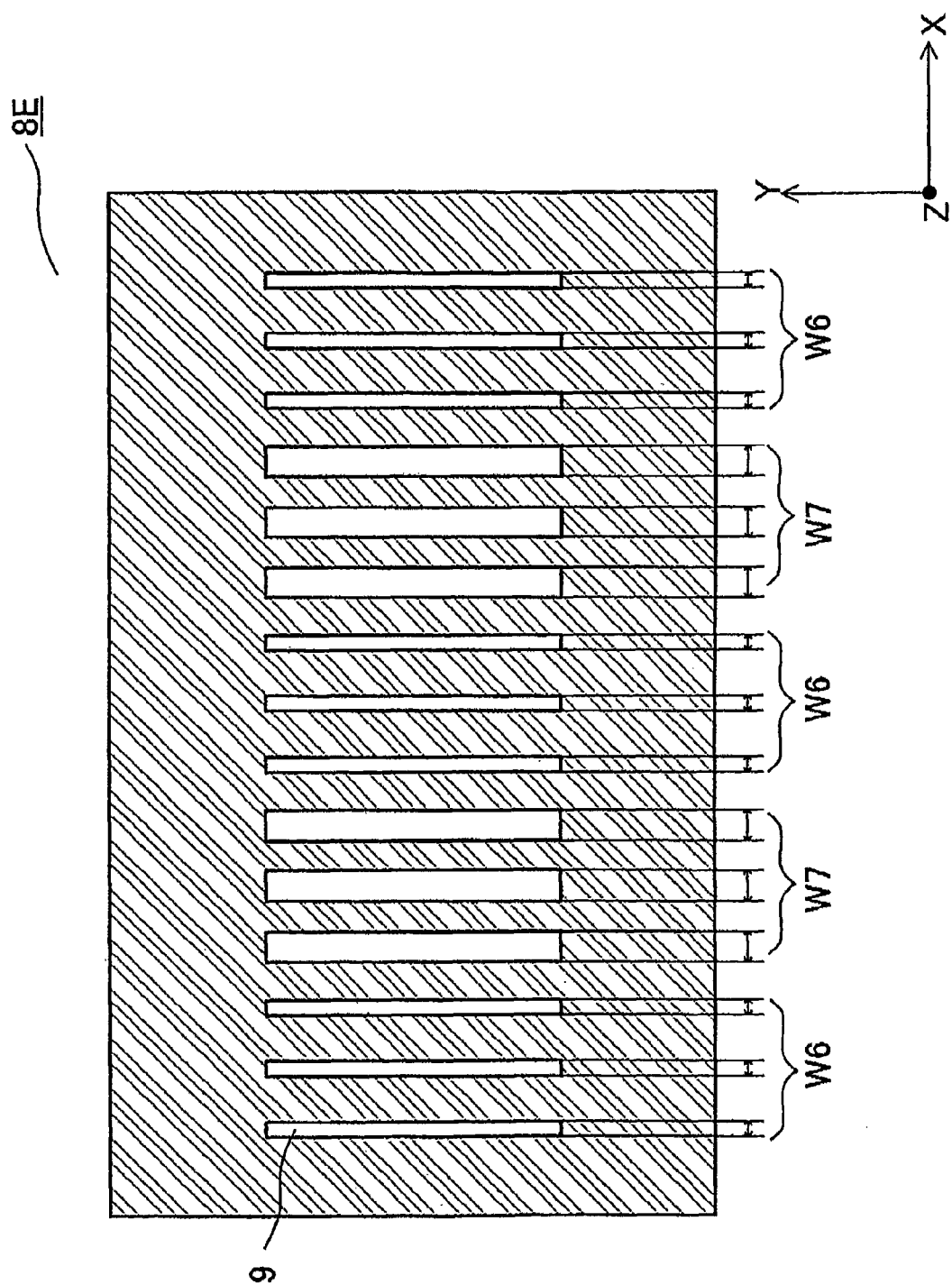
FIG. 6 is a schematic diagram illustrating an exposure mask in which widths of transmission sections are switched every three transmission sections.

FIG. 6 is a schematic diagram illustrating an exposure mask in which widths of transmission sections are switched every three transmission sections.

In an exposure mask 8E, although arrangement pitches between transmission sections 9 are the same, the widths thereof repeatedly alternate between W6 and W7 every three transmission sections as shown in FIG. 6.

In the color filter 1 which is produced by using the exposure mask 8E in the small mask continuous exposure method, the widths of the colored layers 4 are repeatedly switched every three pixels over the entirety of the display area. When the widths of the colored layers 4 are varied, the widths of the overlap portions 5 are also varied. Therefore, the widths of the overlap portions 5 are repeatedly switched every three pixels over the entirety of the display area.

When the exposure masks as described above with reference to FIG. 2 to FIG. 6 are used to form the colored layers in the small mask continuous exposure method, variations of the pitches and/or widths partially occur in a resist pattern formed by a single exposure mask. However, when the patterns are sequentially formed on a substrate by using a plurality of the exposure masks, the pattern is formed through baking such that the pattern of the single exposure mask is scattered uniformly over the entirety of the substrate, so that partial variation caused by the single exposure mask is scattered over the entirety of the pixel area. As a result, if the widths of the overlap portions are varied due to misalignment in position of the exposure heads and/or variation in exposure condition, the variation in width of the overlap portions can be blended into the variation in width of the overlap portions which is intentionally generated over the entirety of the pixel area. Therefore, in the color filters of the present embodiment which are produced by using the exposure masks described above in the small mask continuous exposure method, partial variation in size and position of the color patterns caused by misalignment in position and/or the like is unlikely to be conspicuous, so that the liquid crystal display device can be realized which has few variation in image quality when the entirety of the pixel area is viewed.

Although in the present embodiment the pitches between the colored layers and/or the widths of the colored layers are varied in the color filter, the pitches between the black matrixes and/or the widths of the black matrixes may be varied, instead of the pitches between the colored layers and/or the widths of the colored layers. Alternatively, the pitches between the colored layers and the pitches between the black matrixes, and/or the widths of the colored layers and the widths of the black matrixes may be varied. The pitches between the colored layers and/or the widths of the colored layers may be varied in all the red, green, and blue colored layers, or the pitches between the colored layers, and/or the widths of the colored layers may be varied in the colored layers of a specific color only.

Further, an exemplary case where all the pitches between the transmission sections, and/or all the widths of the transmission sections are varied over the entirety of the exposure mask, and an exemplary case where the pitches between the transmission sections, and/or the widths of the transmission sections may be varied for, for example, a predetermined number of transmission sections, are described in the present embodiment. However, the pitches between the transmission sections, and/or the widths of the transmission sections may be varied only in a restrictive range of the exposure mask as compared to the above-described exemplary cases. Also in this case, since a plurality of masks are used in the small mask continuous exposure method, variation in size of the overlap portions can be distributed over the entirety of the pixel area.

Further, although in the present embodiment black matrixes are used as light shielding layers, the present invention is not limited thereto. For example, electrode layers that are formed of thin metal film and formed on a substrate may be used.

EXAMPLES

Hereinafter, examples where the present invention was implemented in practice will be described. In examples 1 to 5, variation in size of the colored patterns was generated over the entirety of the pixel area by using the exposure masks shown in FIG. 2 to FIG. 6, respectively. Further, in examples 6 to 10, variation in size of the black matrixes was generated over the entirety of the pixel area by using the exposure masks shown in FIG. 2 to FIG. 6, respectively.

Firstly, a black matrix pattern, a band-shaped light-shielding area around a colored layer area, a periphery dummy pattern, and alignment marks for alignment in position were formed on a substrate by using black-pigment-dispersed resist in the photolithography method.

Next, a colored resist which includes: a red pigment; a monomer having a transparent resin and an unsaturated ethylenic double bond; a photo polymerization initiator; and a polymerization inhibitor, and which can be hardened by application of laser light having a wavelength ranging from 340 nm to 380 nm, was applied to the substrate by means of a precision slit coater.

Figure 7:
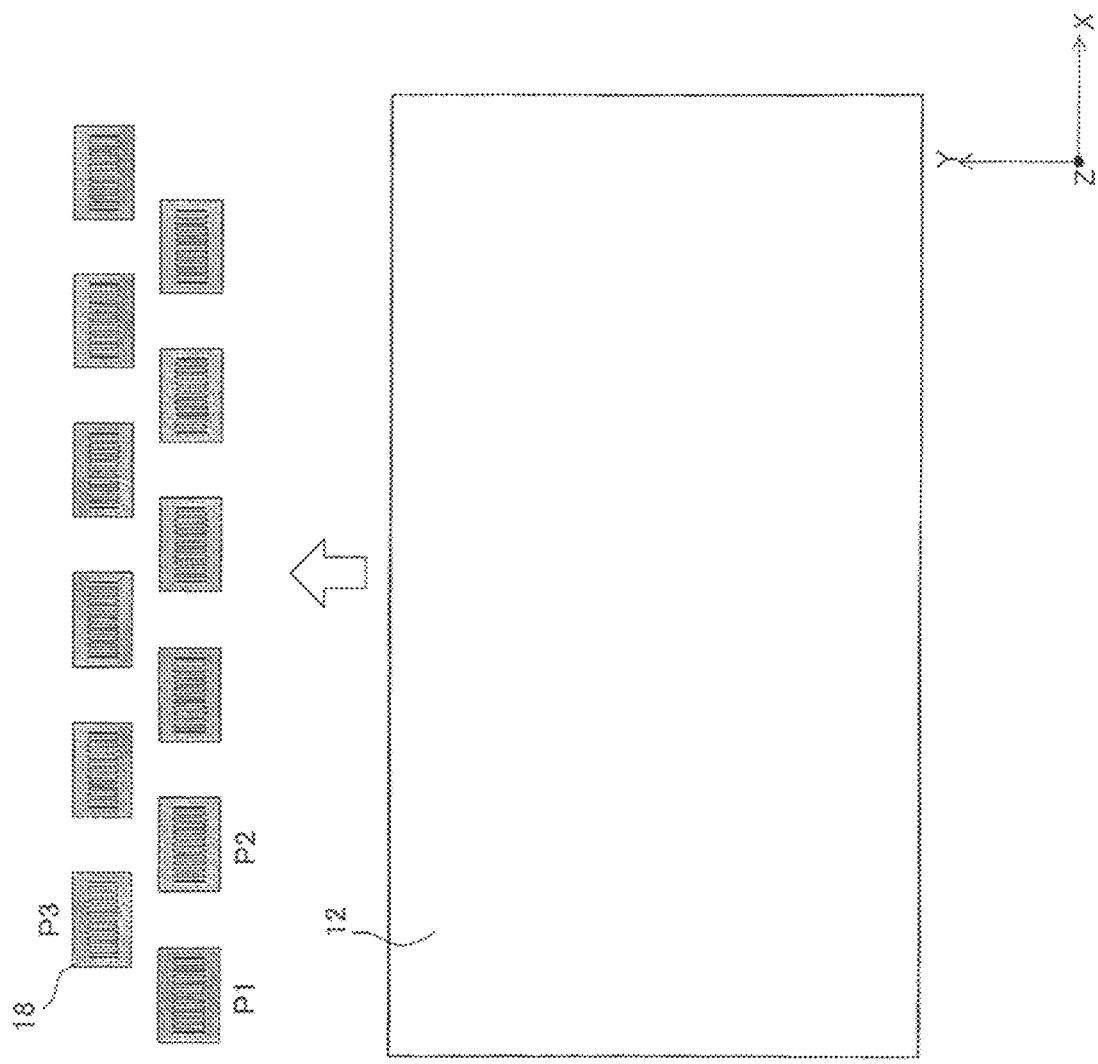
FIG. 7 is a diagram illustrating an arrangement of exposure masks in a small mask continuous exposure method.
Figure 8:
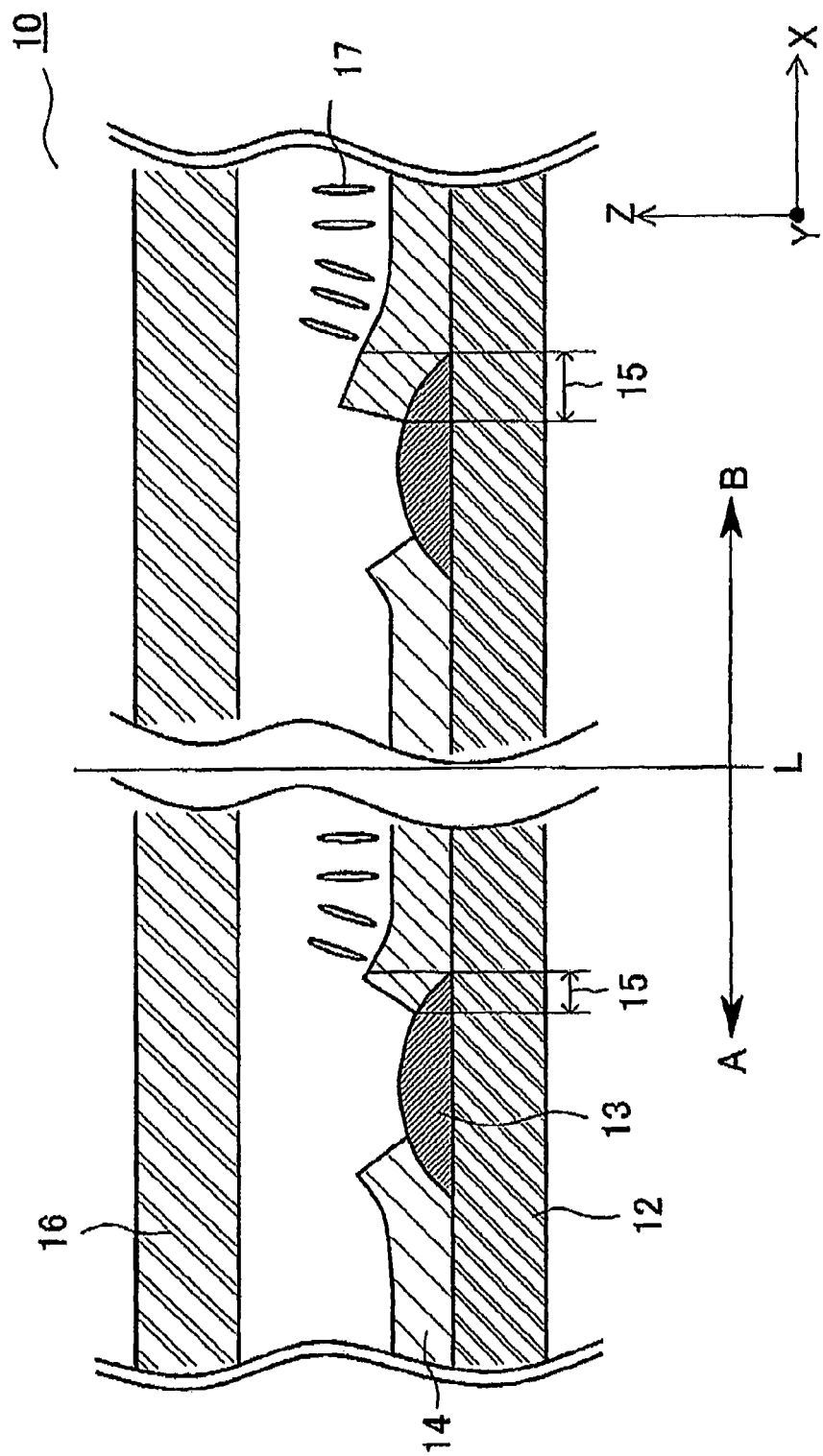
FIG. 8 is a cross-sectional view schematically illustrating a simplified structure of a liquid crystal display device near a joining portion.

The exposure of the resist on the substrate to light was executed by using the small mask continuous exposure method. In the same manner as shown in FIG. 7, six exposure masks were aligned in one row, and six photomasks were similarly positioned in one rear row so as to complement each space between the exposure masks. While the substrate was being conveyed in the Y-axis direction, light was sequentially applied to the resist formed as a film on the substrate through the stripe-shaped transmission sections on the exposure masks, thereby sequentially forming the stripe-shaped colored layer patterns through baking. The exposed positions were sequentially adjusted by a positional relationship between the black matrix patterns on the substrate and the patterns of the exposure masks being recognized on an image by means of a CCD camera, thereby aligning the exposure masks and the substrate with each other.

Thereafter, development, water-rinsing, and baking process steps were performed, thereby forming red colored layers. Subsequent thereto, green and blue colored layers were sequentially formed on the substrate in the similar process steps, to form a color filter.

Example 1

As an exposure mask according to example 1, an exposure mask was used in which each alignment pitch between the transmission sections of the exposure mask shown in FIG. 2 was randomly offset by a value that ranges from −1.5 µm to +1.5 µm, and that was determined in units of 0.05 µm. When each alignment pitch is offset by a value that ranges from −1.5 µm to +1.5 µm, and that is determined in units of 0.05 µm, each alignment pitch can be offset by any one of 61 different values when the value may be 0 µm as a variation amount. However, the offset was made such that each offset appeared with almost the same frequency so as to avoid imbalance in variation.

The exposure condition was optimized such that pattern edges of the adjacent exposure heads were misaligned from each other only by 1 µm or less. Therefore, in the color filter according to example 1, partial variation in width and/or position of the patterns in the joining portions was able to be blended into variation in pitches between the colored layers, which was generated by each pitch between the colored layers being varied by a value in a range of ±1.5 µm, and which was uniformly distributed over the entirety of the color filter.

Thus, in the liquid crystal display device, although minute variation was uniformly generated over the entirety of the display area due to variation of pixel pitches on the entire surface of the substrate, a varied state caused due to partial variation in width and/or position of the colored layers in the joining portions was prevented from becoming conspicuous when observed on a macro scale.

Example 2

As an exposure mask according to example 2, an exposure mask was used in which the width of each transmission section of the exposure mask shown in FIG. 3 was randomly varied by a value that ranges from −1.5 µm to +1.5 µm, and that was determined in units of 0.05 µm. When the width of each transmission section is varied by a value that ranges from −1.5 µm to +1.5 µm, and that is determined in units of 0.05 µm, offset is enabled such that each width can be varied by any one of 61 different values when the value may be 0 µm as a line width variation amount. However, the offset was made such that each offset appeared with almost the same frequency so as to avoid imbalance in variation.

The exposure condition was optimized such that pattern edges of the adjacent exposure heads were misaligned from each other only by 1 µm or less. Therefore, partial variation in width and/or position of the patterns in the joining portions was able to be blended into variation in pixel width, which was generated by each pixel width being varied by a value in a range of ±1.5 µm, and which was uniformly distributed over the entirety of the color filter.

Example 3

As an exposure mask according to example 3, an exposure mask was used in which each alignment pitch between the transmission sections of the exposure mask shown in FIG. 4 was randomly offset by a value that ranges from −1.5 µm to +1.5 µm, and that was determined in units of 0.05 µm. When each alignment pitch is offset by a value that ranges from −1.5 µm to +1.5 µm, and that is determined in units of 0.05 µm, each alignment pitch can be offset by any one of 61 different values when the value may be 0 µm as a variation amount. However, the offset was made such that each offset appeared with almost the same frequency so as to avoid imbalance in variation. Further, the width of each transmission section of the exposure mask was randomly varied by a value that ranges from −1.5 µm to +1.5 µm, and that was determined in units of 0.05 µm. When the width of each transmission section is varied by a value that ranges from −1.5 µm to +1.5 µm, and that is determined in units of 0.05 µm, offset is enabled such that each width can be varied by any one of 61 different values when the value may be 0 µm as a line width variation amount. However, the offset was made such that each offset appeared with almost the same frequency so as to avoid imbalance in variation.

The exposure condition was optimized such that pattern edges of the adjacent exposure heads were misaligned from each other only by 1 µm or less. Therefore, partial variation in width and/or position of the patterns in the joining portions was able to be blended into variation of pitches between the colored layers, which was generated by each pitch between the colored layers being varied by a value in a range of ±1.5 µm, and which was uniformly distributed over the entirety of color filter, and into variation in pixel width, which was generated by each pixel width being varied by a value in a range of ±1.5 µm, and which was uniformly distributed over the entirety of the color filter.

Example 4

As an exposure mask according to example 4, an exposure mask was used in which pitches between the transmission sections of the exposure mask shown in FIG. 5 were deviated, by 0.5 µm, from a designed value of the alignment pitch, in one direction and in the opposite direction along the X-axis direction shown in FIG. 5 alternately every three pixels (at intervals of about 1 mm).

The exposure condition was optimized such that pattern edges of the adjacent exposure heads were misaligned from each other only by 1 µm or less. Therefore, partial variation in width and/or position of the patterns in the joining portions was able to be blended into variation of pitches between colored layers, which was generated by the pitches between the colored layers being varied by one of ±1.5 µm, and which was uniformly distributed over the entirety of the color filter.

Example 5

As an exposure mask according to example 5, an exposure mask was used in which the widths of the transmission sections of the exposure mask shown in FIG. 6 were alternately increased and reduced, by 0.5 µm, from a reference value of the width, every three pixels (at intervals of about 1 mm).

The exposure condition was optimized such that pattern edges were misaligned from each other only by 1 µm or less. Therefore, partial variation in width and/or position of the patterns in the joining portions was able to be blended into variation in width of colored layers, which was generated by the width of the colored layers being varied by one of ±1.5 µm, and which was uniformly distributed over the entirety of the color filter.

Example 6

As an exposure mask according to example 6, an exposure mask was used in which each alignment pitch between the transmission sections of the exposure mask shown in FIG. 2 was randomly varied by a value that ranges from −1.5 µm to +1.5 µm, and that was determined in units of 0.05 µm. When each alignment pitch is varied by a value that ranges from −1.5 µm to +1.5 µm, and that is determined in units of 0.05

μm, each alignment pitch can be offset by any one of 61 different values when the value may be 0 μm as a variation amount. However, the offset was made such that each offset appeared with almost the same frequency so as to avoid imbalance in variation.

The exposure condition was optimized such that pattern edges of the adjacent exposure heads were misaligned from each other only by 1 μm or less. Therefore, in the color filter according to example 6, partial variation in width and/or position of the patterns in the joining portions was able to be blended into variation of pitches between black matrixes, which was generated by each pitch between the black matrixes being varied by a value in a range of ±1.5 μm, and which was uniformly distributed over the entirety of the color filter.

Thus, in the liquid crystal display device, although minute variation was uniformly generated over the entirety of the display area due to variation of pitches between the black matrixes on the entire surface of the substrate, a varied state caused in a specific portion due to partial variation was prevented from becoming conspicuous when observed on a macro scale.

Example 7

As an exposure mask according to example 7, an exposure mask was used in which the line width of each slit pattern of the transmission section of the exposure mask shown in FIG. 3 was randomly varied by a value that ranges from −1.5 μm to +1.5 μm, and that was determined in units of 0.05 μm. When the line width of each slit pattern is varied by a value that ranges from −1.5 μm to +1.5 μm, and that is determined in units of 0.05 μm, offset is enabled such that each line width can be varied by any one of 61 different values when the value may be 0 μm as a line width variation amount. However, the offset was made such that each offset appeared with almost the same frequency so as to avoid imbalance in variation.

The exposure condition was optimized such that pattern edges of the adjacent exposure heads were misaligned from each other only by 1 μm or less. Therefore, partial variation in width and/or position of the patterns in the joining portions was able to be blended into variation in width of black matrixes, which was generated by the width of each black matrix being varied by a value in a range of ±1.5 μm, and which was uniformly distributed over the entirety of the color filter.

Example 8

As an exposure mask according to example 8, an exposure mask was used in which the line width of each slit pattern of the transmission section of the exposure mask shown in FIG. 4 was randomly varied by a value that ranges from −1.5 μm to +1.5 μm, and that was determined in units of 0.05 μm. When the line width of each slit pattern is varied by a value that ranges from −1.5 μm to +1.5 μm, and that is determined in units of 0.05 μm, offset is enabled such that each line width can be varied by any one of 61 different values when the value may be 0 μm as a line width variation amount. However, the offset was made such that each offset appeared with almost the same frequency so as to avoid imbalance in variation. Further, the width of each transmission section of the exposure mask was randomly varied by a value that ranges from −1.5 μm to +1.5 μm, and that was determined in units of 0.05 μm. When the width of each transmission section is varied by a value that ranges from −1.5 μm to +1.5 μm, and that is determined in units of 0.05 μm, each width can be offset by any one of 61 different values when the value may be 0 μm as a line width variation amount. However, the offset was made such that each offset appeared with almost the same frequency so as to avoid imbalance in variation.

The exposure condition was optimized such that pattern edges of the adjacent exposure heads were misaligned from each other only by 1 μm or less. Therefore, partial variation in width and/or position of the patterns in the joining portions was able to be blended into variation of the pitches between black matrixes, which was generated by each pitch between the black matrixes being varied by a value in a range of ±1.5 μm, and which was uniformly distributed over the entirety of the color filter, and into variation in width of the black matrixes, which was generated by the width of each black matrix being varied by a value in a range of ±1.5 μm, and which was uniformly distributed over the entirety of the color filter.

Example 9

As an exposure mask according to example 9, an exposure mask was used in which alignment pitches between the transmission sections of the exposure mask shown in FIG. 5 were deviated, by 0.5 μm, in one direction and in the opposite direction along the X-axis direction shown in FIG. 5 alternately every three pixels (at intervals of about 1 mm).

The exposure condition was optimized such that pattern edges of the adjacent exposure heads were misaligned from each other only by 1 μm or less. Therefore, partial variation in width and/or position of the patterns in the joining portions was able to be blended into variation of pitches between black matrixes, which was generated by the pitches between the black matrixes being varied by one of ±1.5 μm, and which was uniformly distributed over the entirety of the color filter.

Example 10

As an exposure mask according to example 10, an exposure mask was used in which the widths of the transmission sections of the exposure mask shown in FIG. 6 were alternately increased and reduced, by 0.5 μm, from a reference value of the width, every three pixels (at intervals of about 1 mm).

The exposure condition was optimized such that pattern edges were misaligned from each other only by 1 μm or less. Therefore, partial variation in width and/or position of the patterns in the joining portions was able to be blended into variation in width of black matrixes, which was generated by the width of the black matrixes being varied by one of ±1.5 μm, and which was uniformly distributed over the entirety of the color filter.

INDUSTRIAL APPLICABILITY

The present invention is applicable to, for example, a liquid crystal display device including a colored filter.

DESCRIPTION OF THE REFERENCE CHARACTERS 1 color filter
2, 12 substrate
3, 13 black matrix
4, 14 colored layer
5, 15 overlap portion
8A to 8D, 18 exposure mask
9 transmission section
10 liquid crystal display device 16 opposing substrate
17 liquid crystal

The invention claimed is:

1. A color filter for use in a liquid crystal display device having a plurality of pixels aligned in a first direction and a second direction orthogonal to the first direction, the color filter comprising:
a substrate;
light shielding layers provided on the substrate; and
a plurality of colored layers that partially overlap the light shielding layers in at least the first direction, wherein
the widths of overlap portions in which the light shielding layers and the plurality of colored layers overlap each other in the first direction are varied over the entirety of a display area, and a degree of variation of the widths of the overlap portions is uniform over the entirety of the display area.

2. The color filter according to claim 1, wherein at least one of alignment pitches between the light shielding layers and alignment pitches between the colored layers is randomly varied, so that the degree of the variation of the widths of the overlap portions is uniform over the entirety of the display area.

3. The color filter according to claim 1, wherein at least one of widths of the light shielding layers and widths of the plurality of colored layers is randomly varied, so that the degree of the variation of the widths of the overlap portions is uniform over the entirety of the display area.

4. The color filter according to claim 1, wherein at least one of alignment pitches between the light shielding layers and alignment pitches between the colored layers is randomly varied, and at least one of widths of the light shielding layers and widths of the plurality of colored layers is randomly varied, so that the degree of the variation of the widths of the overlap portions is uniform over the entirety of the display area.

5. The color filter according to claim 1, wherein at least one of alignment pitches between the light shielding layers and alignment pitches between the colored layers is varied at least every two pixels, so that the degree of the variation of the widths of the overlap portions is uniform over the entirety of the display area.

6. The color filter according to claim 1, wherein at least one of widths of the light shielding layers and widths of the plurality of colored layers is varied at least every two pixels, so that the degree of the variation of the widths of the overlap portions is uniform over the entirety of the display area.

7. A liquid crystal display device having a plurality of pixels aligned in a first direction and a second direction orthogonal to the first direction, the liquid crystal display device comprising:
a color filter;
an opposing substrate that opposes the color filter; and
liquid crystal sealed between the color filter and the opposing substrate, wherein the color filter includes:
a substrate;
light shielding layers provided on the substrate; and
a plurality of colored layers that partially overlap the light shielding layers in at least the first direction, and
the widths of overlap portions in which the light shielding layers and the plurality of colored layers overlap each other in the first direction are varied over the entirety of a display area, and a degree of variation of the widths of the overlap portions is uniform over the entirety of the display area.

8. An exposure mask that is used to produce the color filter according to claim 1, that is mounted to a corresponding one of a plurality of exposure heads which are positioned so as to form a matrix, and that is used to sequentially expose, to light, an exposed area on the substrate which is being conveyed below the plurality of exposure heads, for forming at least one of light shielding layers and colored layers, the exposure mask comprising:
a plurality of transmission sections that are each slit-shaped, and transmit light, wherein
at least one of widths of the plurality of transmission sections and pitches between the transmission sections adjacent to each other is varied in size.

9. The color filter according to claim 5, wherein at least one of widths of the light shielding layers and widths of the plurality of colored layers is varied at least every two pixels, so that the degree of the variation of the widths of the overlap portions is uniform over the entirety of the display area.

* * * * *